(12) United States Patent
Hotta

(10) Patent No.: US 7,227,187 B2
(45) Date of Patent: Jun. 5, 2007

(54) SEMICONDUCTOR DEVICE AND MANUFACTURING METHOD THEREOF

(75) Inventor: Kazushige Hotta, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/250,494

(22) Filed: Oct. 17, 2005

(65) Prior Publication Data

US 2006/0081852 A1    Apr. 20, 2006

(30) Foreign Application Priority Data

Oct. 18, 2004    (JP)    ............................. 2004-302572

(51) Int. Cl.
*H01L 29/06*    (2006.01)

(52) U.S. Cl. ............................. 257/64; 257/59; 257/72; 257/E29.003; 257/E27.131; 257/E27.132; 257/E29.117; 349/42; 349/43; 349/151

(58) Field of Classification Search .................. 257/59, 257/64, 72, E29.003, E29.131, E29.132, 257/E29.117; 349/42, 43, 151
See application file for complete search history.

(56) References Cited

U.S. PATENT DOCUMENTS

| 6,737,672 | B2 | 5/2004 | Hara et al. |
| 6,821,343 | B2 | 11/2004 | Hara et al. |
| 6,861,328 | B2 | 3/2005 | Hara et al. |
| 2003/0025127 | A1 | 2/2003 | Yanai et al. |
| 2004/0206956 | A1* | 10/2004 | Yanai et al. .................. 257/59 |

FOREIGN PATENT DOCUMENTS

| JP | 11-281997 A | 10/1999 |
| JP | 2003-45892 A | 2/2003 |
| JP | 2003-86505 A | 3/2003 |

* cited by examiner

*Primary Examiner*—Minhloan Tran
*Assistant Examiner*—Eduardo A. Rodela
(74) *Attorney, Agent, or Firm*—Nixon & Vanderhye, P.C.

(57) ABSTRACT

To obtain a semiconductor device containing TFTs of different, suitable properties as display pixel TFTs and high-voltage, driver-circuit TFTs, the semiconductor device of the present invention includes: first and second islands-shaped polycrystalline silicon (p-Si) layers provided above an insulating substrate and having relatively large grain sizes; a third islands-shaped p-Si layer having relatively small grain sizes; a first gate insulating film provided on the first p-Si layer and having a first thickness; second and third gate insulating films provided on the second and third p-Si layers having second and third thicknesses which are not less than the first thickness; gate electrodes provided on the gate insulating films; n-type high-concentration source/drain regions formed by adding an n-type impurity to a high concentration outside channel regions; and second and third n-type low-concentration source/drain regions provided between the channel regions and the n-type high-concentration source/drain regions of the second and third p-Si layers. The third n-type low-concentration source/drain regions have a higher impurity dose than the second n-type low-concentration source/drain regions.

6 Claims, 13 Drawing Sheets

# SEMICONDUCTOR DEVICE AND MANUFACTURING METHOD THEREOF

This nonprovisional application claims priority under 35 U.S.C. § 119(a) on Patent Application No. 2004-302572 filed in Japan on Oct. 18, 2004, the entire contents of which are hereby incorporated by reference.

FIELD OF THE INVENTION

The present invention relates in general to a semiconductor device with thin film transistors and its manufacturing method and in particular to a semiconductor device with a polycrystalline silicon thin film and its manufacturing method.

BACKGROUND OF THE INVENTION

Liquid crystal displays and organic EL displays having been used lately as flat panel displays. The displays will exhibit enhanced perform if they employs an active matrix in which each display pixel has a switching (active) element, such as a thin film transistor (TFT). These active matrix substrates are used in many personal computers (PC) and mobile phones, to name a few examples.

To form thin film transistors (TFTs) on a glass substrate, an amorphous silicon layer was originally used in view of the constraints on the thermal resistance temperature of the glass substrate. Recently, polycrystalline silicon transistors have been manufactured by either polycrystallizing the amorphous silicon layer or depositing a polycrystalline silicon layer in the first place. With much improved mobility, the polycrystalline silicon transistor boasts higher performance than the amorphous silicon transistor. The use of a polycrystalline silicon layer allows driver circuitry to be formed on the same substrate. These features are being pursued for the development of new transistors with enhanced performance and reduced power consumption.

One of polycrystallization techniques involves the scanning of the amorphous silicon layer with a linear excimer laser. The technique is capable of efficient crystallization of a large-area amorphous silicon layer, but the obtained grain sizes of polycrystalline silicon are small.

Also, new crystallization techniques are being proposed to further enhance the TFT performance. It is reported that lateral growth involving the use of continuous wave (CW) laser can achieve greater grain sizes. The CW laser forms a tiny spot, capable of fabricating an island in the semiconductor layer, which is often followed by crystallization.

High speed driver circuits are desirable for liquid crystal displays. The driver contains a display controller and a shift register. Those TFTs for which high speed operation is expected preferably have short channel length and contain no LDD structure. The circuit therefore desirably operates on low power supply voltage. Typically, to reduce the power supply voltage, the threshold of the TFT needs to be reduced too, which in turn requires to thin down the gate insulating film.

The LCD driver circuit contains an output buffer, level shifters, and analog switches. Preferably, these components will withstand high voltages, that is, the components will operate at high voltages. The TFTs in these components need to operate at high voltage rather than at high speed. So do pixel TFTs. The high-voltage TFTs need to operate at desired high voltages and preferably contain a LDD structure and a gate insulating film with a conventional thickness.

It is difficult for the same TFT structure to meet both the high speed operation (low withstand voltage) and the high withstand voltage requirements. Accordingly, an approach is being proposed to form 2 types of TFTs on the same substrate. High-voltage TFTs are provided with a thick gate insulating film, and high-speed-operation (low withstand voltage) TFTs with a thin gate insulating film.

Japanese Unexamined Patent Publication 2003-45892 (Tokukai 2003-45892; published Feb. 6, 2003) proposes formation of an islands-shaped semiconductor layer and subsequent formation of a first gate insulating layer suitable for low-voltage TFTs. For low-voltage transistors, the gate electrodes are provided on the layer. For high-voltage transistors and pixel transistors, a second gate insulating layer is further provided on the first gate insulating layer, with the gate electrodes being provided on the second gate insulating layer. The first gate insulating layer for the low-voltage transistors is, for example, 30 nm thick. The gate insulating layer for the high-voltage transistors and pixel transistors which is a stack of the first and second gate insulating films is, for example, 110 nm thick.

Japanese Unexamined Patent Publication 2003-86505 (Tokukai 2003-86505; published Mar. 20, 2003) proposes approach where an amorphous semiconductor layer is patterned to islands. The amorphous layer is polycrystallized under a continuous wave (CW) laser beam from a diode-pumped solid-state (DPSS) laser through the back surface of the transparent substrate. The Publication describes this crystallization method produces large grains.

In TFT manufacture, an impurity is activated by laser annealing with an excimer laser or thermal annealing. In the excimer laser annealing, the gate lines may be made of aluminum or an aluminum alloy for low resistance. To obtain high reliability, the thermal annealing is preferred. This is especially so when high-speed-operation circuits are to be constructed of dedicated TFTs and when CW laser beams are to be used in crystallization. In the thermal annealing, the gate lines are made of a metal with a high melting point. Aluminum and its alloys are not suitable.

Japanese Unexamined Patent Publication 11-281997/1999 (Tokukaihei 11-281997; published Oct. 15, 1999) describes that driver-circuit TFTs are required to exhibit low threshold and high mobility and that pixel TFTs are required to exhibit high threshold and low mobility. To fulfill these requirements, the Publication proposes to thin down a part of the undoped amorphous silicon layer by etching and stack a B-doped amorphous silicon layer on the undoped layer. The amorphous layers are then crystallized. The pixel TFTs are formed from the resultant thick polycrystalline silicon layers where the average grain size is small and the mobility is low. The driver-circuit TFTs are formed from the thin polycrystalline silicon layer with a low B concentration where the average grain size is large and the mobility is high.

Further, there are various requirements on high-voltage transistors. Pixel transistors are required to allow small leak current; operation speed does not really matter. The high-voltage transistors in peripheral circuits are preferably able to operate at high speed; leak current is allowable to some extent. It is desirable to manufacture these thin film transistors with different properties in the least possible steps.

SUMMARY OF THE INVENTION

The present invention has an objective to provide a semiconductor device containing TFTs of different properties, some suitable for display pixel TFTs and others for high-voltage, driver-circuit TFTs, which are produced in a minimum number of steps, and to provide a manufacturing method for such a device.

The present invention has another objective to provide a properties-enhanced semiconductor device containing high-voltage, low-leak TFTs and high-voltage, high-drive-capability TFTs, and to provide a manufacturing method for such a device.

According to an aspect of the present invention, the semiconductor device of the present invention, to address the issues, is characterized in that the device includes: an insulating substrate; first and second islands-shaped polycrystalline silicon layers provided above the insulating substrate and having relatively large grain sizes; a third islands-shaped polycrystalline silicon layer provided above the insulating substrate and having relatively small grain sizes; a first gate insulating film provided on the first islands-shaped polycrystalline silicon layer and having a first thickness; a second gate insulating film provided on the second islands-shaped polycrystalline silicon layer and having a second thickness which is greater than the first thickness; a third gate insulating film provided on the third islands-shaped polycrystalline silicon layer and having a third thickness which is greater than the first thickness; first, second, and third gate electrodes provided on the first, second, and third gate insulating films to define first, second, and third channel regions therebelow; first, second, and third n-type high-concentration source/drain regions formed by adding an n-type impurity to a high concentration outside the first, second, and third channel regions; and second and third n-type low-concentration source/drain regions provided between the second and third channel regions and the second and third n-type high-concentration source/drain regions, the second and third n-type low-concentration source/drain regions having a lower n-type impurity dose than the n-type high-concentration source/drain regions, wherein the third n-type low-concentration source/drain regions have a higher n-type impurity dose than the second n-type low-concentration source/drain regions.

In the semiconductor device of the present invention, it is preferable if the first, second, and third islands-shaped polycrystalline silicon layers containing the n-type high-concentration source/drain regions and the n-type low-concentration source/drain regions, the first, second, and third gate insulating films, and the first, second, and third gate electrodes constitute first, second, and third thin film transistors.

According to another aspect of the present invention, the method of manufacturing a semiconductor device of the present invention, to address the issues, is characterized in that the method includes the steps of: (a) forming first, second, and fourth islands-shaped polycrystalline silicon layers having relatively large grain sizes and a third islands-shaped polycrystalline silicon layer having relatively small grain sizes above an insulating substrate; (b) forming a first gate insulating film having a first thickness on the first islands-shaped polycrystalline silicon layer; (c) forming second, third, and fourth gate insulating films having second, third, and fourth thicknesses which are all not less than the first thickness on the second, third, and fourth islands-shaped polycrystalline silicon layers; (d) forming first to fourth gate electrodes on the first to fourth gate insulating films to define first to fourth channel regions; (e) adding an n-type impurity to a low concentration to the first to fourth islands-shaped polycrystalline silicon layers by using the gate electrodes as a mask; (f) patterning the first gate insulating film to the shape of the first gate electrodes and patterning the second and third gate insulating films so that the second and third gate insulating films project from the second and third gate electrodes; (g) masking a gate insulating film on the fourth islands-shaped polycrystalline silicon layer and the second islands-shaped polycrystalline silicon layer and adding an n-type impurity at a different acceleration voltage; and (h) masking the first, second, and third polycrystalline silicon layers and adding a p-type impurity to the fourth polycrystalline silicon layer at a different acceleration voltage.

According to a further aspect of the present invention, the method of manufacturing a semiconductor device of the present invention, to address the issues, is characterized in that the method includes the steps of: (a) forming first, second, and fourth islands-shaped polycrystalline silicon layers having relatively large grain sizes and a third islands-shaped polycrystalline silicon layer having relatively small grain sizes above an insulating substrate; (b) forming a first gate insulating film having a first thickness on the first islands-shaped polycrystalline silicon layer; (c) forming second, third, and fourth gate insulating films having second, third, and fourth thicknesses which are all not less than the first thickness on the second, third, and fourth islands-shaped polycrystalline silicon layers; (d) forming first to fourth gate electrodes on the first to fourth gate insulating films to define first to fourth channel regions; (e) adding an n-type impurity to a low concentration to the first to fourth islands-shaped polycrystalline silicon layers by using the gate electrodes as a mask; (i) masking the first, second, and fourth islands-shaped polycrystalline silicon layers and adding an n-type impurity to a low concentration to the third islands-shaped polycrystalline silicon layer; and (h) masking the first, second, and third polycrystalline silicon layers and adding a p-type impurity to the fourth polycrystalline silicon layer.

In the above method of manufacturing a semiconductor device, first to fourth thin film transistors are preferably manufactured including second and third thin film transistors having low-concentration source/drain regions which have different impurity doses.

As explained above, according to the present invention, polycrystalline semiconductor films having relatively large grain sizes (first, second, and fourth islands-shaped polycrystalline silicon layers) and a polycrystalline semiconductor film having relatively small grain sizes (third islands-shaped polycrystalline silicon layer). In addition, property shortcomings can be adjusted by selective doping.

Additional objects, advantages and novel features of the invention will be set forth in part in the description which follows, and in part will become apparent to those skilled in the art upon examination of the following or may be learned by practice of the invention.

DESCRIPTION OF THE EMBODIMENTS

LCD TFTs are divided into those which preferably operate at high speed, those which preferably operate at high voltage and provide high drive capability, and those, like pixel TFTs, which preferably operate at high voltage and allow small leak current.

Figure 7:
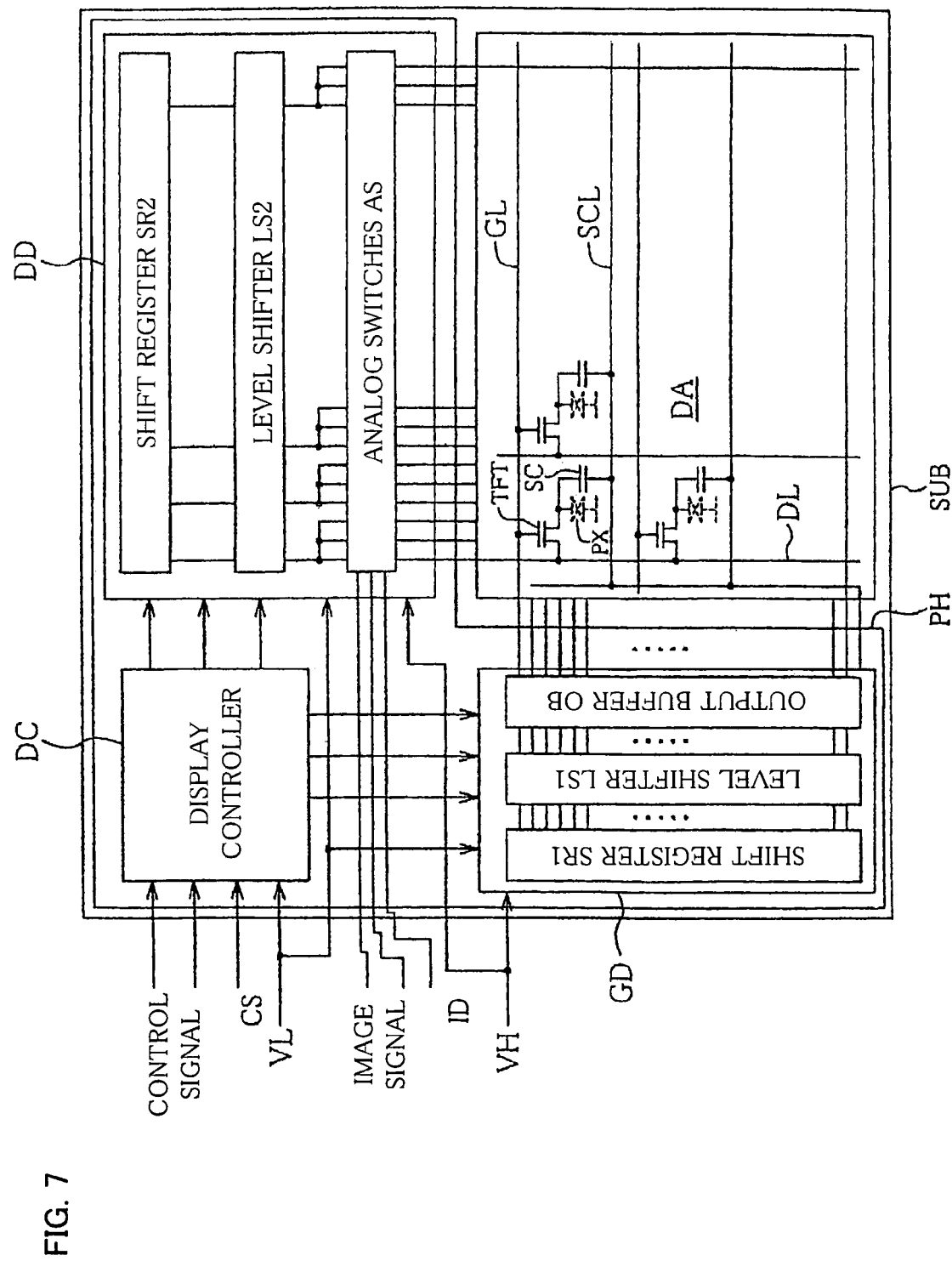
FIG. 7 is a plan view illustrating the configuration of an LCD-TFT substrate.

FIG. 7 shows an exemplary configuration of an active matrix substrate. A display area DA where a display is produced and a peripheral circuit area PH where peripheral circuitry is provided are reserved on an insulating, transparent glass substrate SUB. In the display area DA, there extend scan-use gate lines (bus lines) GL in the row (horizontal) direction and image data lines (bus lines) PL for image data input in the column (vertical) direction.

A thin film transistor TFT is connected to each intersection of the scan-use gate lines GL and the image data lines DL. The output of the thin film transistor is coupled to a pixel electrode PX made of a transparent material, for example, ITO. Each pixel electrode PX is connected to a supplemental capacitor SC. The remaining one of electrodes of the supplemental capacitor SC is connected a supplemental capacitor line (bus line) SCL retained at a constant potential. In the FIG. 7 configuration, the supplemental capacitor lines SCL extend in the row direction. The lines SCL may however laid out to extend in the column direction.

In the peripheral circuit area PH are formed a gate driver GD, a data driver DD, and a display controller DC. The gate driver GD produces scan signals which will be fed to the gate lines for scanning. The data driver DD feeds image data to the image data lines. The display controller DC controls the gate driver GD and the gate driver DD under an externally fed control signal CS. The gate driver GD contains a shift register SR1, a level shifter LS1, and an output buffer OB. The gate driver DD contains a shift register SR2, a level shifter LS2, and an analog switch AS. Further, a reference voltage VL, a reference voltage VH, and an image signal ID are fed externally.

In the integrated peripheral circuitry on the active matrix substrate, the display controller DC and the shift registers SR1, SR2 are required to operate at relatively high speed. The level shifter LS1, the level shifter LS2, the output buffer OB, and the analog switch AS are required to operate at relatively high voltage (i.e., high withstand voltage) and preferably provide high drive capability.

The switching thin film transistors (TFTs) in the display area DA are required to operate at relatively high voltage. The high-voltage, driver-circuit TFTs and the pixel TFTs are fabricated from high-voltage TFTs. It is preferred that the peripheral circuit area PH is a CMOS circuit even when all the TFTs in the display area DA are fabricated from n-channel TFTs. Therefore, the peripheral circuit area PH includes p-channel TFTs, as well as n-channel TFTs. For a typical display device circuit made of polycrystalline silicon, the supplemental capacitor is a MOS capacitor.

7 to 10 V or higher voltage is applied to the pixel TFT to reliably provide necessary voltage for liquid crystal driving. This necessitates a sufficiently thick gate insulating film in view of the withstand voltage for the gate. If the peripheral-circuit TFT was fabricated from a TFT with the same structure as the pixel TFT, the operating voltage of the peripheral circuitry increases, resulting in high power consumption.

The crystallization of an amorphous silicon (a-Si) film under a continuous wave (CW) laser provides large grains. The a-Si film is desirably 50 nm thick or even thicker. The polycrystallization using a CW laser is suitable for the polycrystallization of select areas, hence for the manufacture of polycrystalline TFTs with large grain size, high mobility, and large off leak current.

Meanwhile, the crystallization of an a-Si film under an excimer laser provides relatively small grains across the area. The a-Si film is desirably 40 nm to 60 nm thick. The polycrystallize using an excimer laser is suitable for the polycrystallize across the area, hence for the manufacture of polycrystalline TFTs with small grain size, low mobility, and small off leak current.

The polycrystalline silicon (p-Si) film crystallized under a CW laser is of higher mobility than the p-Si film crystallized under an excimer laser. This p-Si film is therefore suitable for high speed operation and has high drive capability. However, the TFT using the p-Si film crystallized under a CW laser suffers from larger photo-induced leak current than the TFT using the a-Si film crystallized under an excimer laser.

This could be solved by the TFTs being made from a silicon layer polycrystallized under a CW laser in the peripheral circuitry and the TFTs being made from a silicon layer polycrystallized under an excimer laser in the pixels.

In Japanese Patent Application (Tokugan 2003-92862), the inventors of the present invention proposed to polycrystallize a relatively thin a-Si film under an excimer laser in the pixels, polycrystallize a relatively thick a-Si film under a CW laser in the peripheral circuitry, so as to provide high-speed-operation TFTs with a thin gate insulating film and also to provide high-voltage circuits and TFTs in the pixels with a thick gate insulating film.

Figure 8:
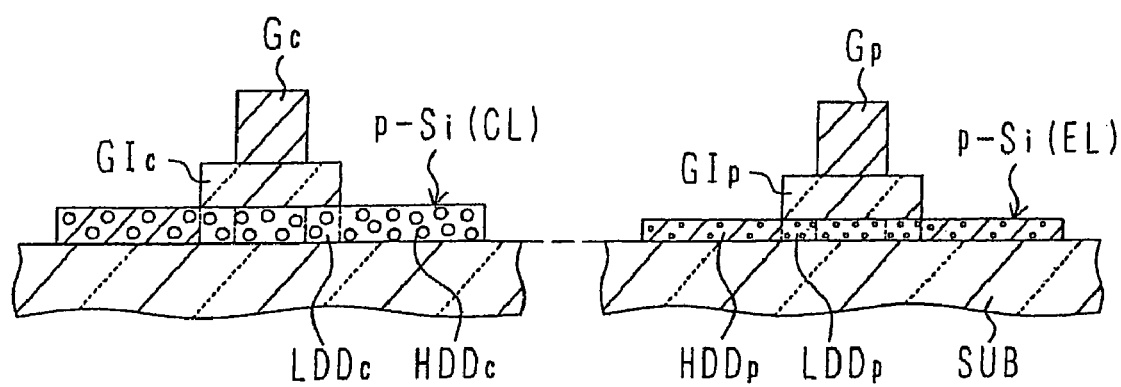
FIG. 8 is a schematic cross-sectional view illustrating the configuration of a high-voltage, peripheral-circuit TFT and a pixel TFT produced in a preliminary experiment.

FIG. 8 is a schematic showing the configuration of a high-voltage peripheral-circuit TFT and a high-voltage pixel TFT. The substrate SUB includes a stack of an oxide film and a nitride film on a glass substrate. On the substrate SUB are formed an islands-shaped silicon film p-Si (CL) prepared by the polycrystallization of a relatively thick a-Si film under a CW laser and an islands-shaped silicon film p-Si (EL) prepared by the polycrystallization of a relatively thin a-Si film under an excimer laser.

Gate insulating films GIc, GIp are formed across the middle section of the islands-shaped silicon films. Each of the films GIc, GIp are, for example, 110 nm thick. Gate electrodes Gc, Gp are formed of a high-melting-point metal, such as Mo, on the gate insulating films. The gate insulating films GIc, GIp and the gate electrodes Gc, Gp are fabricated from the same film of the same material and therefore are of the same thickness.

An n-type impurity is injected through the gate insulating films GIc, GIp on both sides of the gate electrodes Gc, Gp.

Below the gate insulating films GIc, GIp are formed n-type low-concentration regions LDDc, LDDp. On both sides of the gate insulating films GIc, GIp, their foot is doped with n-type high-concentration impurity ions to form n-type high-concentration regions HDDc, HDDp. To adjust the thresholds of the two TFTs at around an equal value, it is preferable to dope the pixel TFT channels with large quantities of p-type impurity ions. The cause would be the impurity activation rate in the polycrystalline silicon film prepared by crystallization under a CW laser being greater than the impurity activation rate in the polycrystalline silicon film prepared by crystallization under an excimer laser.

It has been discovered however that after the threshold adjustment, the two TFTs have vastly different resistances in the LDD region, which makes it difficult for the TFTs to operate properly. Injecting an n-type low-concentration impurity into the TFT formed using a CW laser to a preferred concentration resulted in very high resistance in the LDD region LDDp of the pixel TFT, which in turn caused insufficient ON current and a poor display. Adjusting the concentration of the impurity in the LDD region in line with the polycrystalline silicon film in the pixel TFT decreased the reliability of the peripheral-circuit TFT.

If the high-concentration regions HDDp, HDDc have an equal concentration of impurity, their resistances could differ by up to a factor of 5. However, the difference in resistance has little effect on TFT properties and poses no particular problems. Therefore, the LDD region in the pixel TFT is preferably doped with a larger quantity of impurity than the LDD region in the peripheral-circuit TFT. Note however that there are preferably a minimum number of additional masks and steps involved.

The following will describe a working example of the present invention in reference to figures. First, see FIG. 1(a) to FIG. 1(u) which are cross-sectional views illustrating individual steps according to the semiconductor device manufacturing method of working example 1.

Referring to FIG. 1(a), a 50-nm thick silicon nitride layer 11 and a 200-nm thick silicon oxide layer 12 are deposited sequentially by plasma-enhanced chemical vapor deposition (PE-CVD) on a glass substrate (insulating substrate) 10. On the silicon oxide layer 12, an amorphous silicon film 13 is deposited by PE-CVD to a thickness of 60 nm to 100 nm.

The five regions shown in FIG. 1(a) are, from left to right, those which will respectively be a low-voltage (Vl) p-channel TFT (DRVl-p) in periphery driver circuitry, a high-voltage (Vh) p-channel TFT (DRVh-p) in periphery driver circuitry, a low-voltage, high-speed n-channel TFT (DRVl-n) in periphery driver circuitry, a high-voltage n-channel TFT (DRVh-n) in periphery driver circuitry, and a high-voltage n-channel TFT (PIXVh-n) for a pixel.

Of the TFTs which will be manufactured in the five regions of FIG. 1(a), the "first thin film transistor" corresponds to DRVl-n, the "second thin film transistor" to DRVh-n, the "third thin film transistor" to PIXVh-n, and the "fourth thin film transistor" to DRVl-p or DRVh-p.

As shown in FIG. 1(b), a resist pattern 1M is formed which covers the island regions in which the peripheral-circuitry transistors will be manufactured. The silicon film 13 is dry etched using a fluorine-based gas. In the pixel TFT region, the silicon film 13 is completely removed. On the other hand, in the peripheral circuit area, the islands-shaped silicon film 13 remains in the regions where the transistors will be manufactured. The crystallization by illumination by the CW laser CL is done by scanning the film with a laser beam spot. Therefore, it is preferable if the silicon film is patterned to form islands in advance.

Referring to FIG. 1(c), a mask 2M is formed which will be used in the formation of openings in the n-channel TFT region in the peripheral circuitry. The substrate 10 is doped with B ions (p-type impurity) at 10 keV to a dose of $1 \times 10^{13}$ $cm^{-2}$ to adjust the thresholds. Thereafter, the resist mask 2M is removed.

Referring to FIG. 1(d), a silicon oxide film 21 is deposited to a thickness of 100 nm by CVD on the substrate which now has the islands-patterned silicon film. The silicon oxide film 21 will provide a gate insulating film for low-voltage high-speed-operation TFTs. On the silicon oxide film 21, an amorphous silicon film 22 is deposited up to a thickness of 40 nm to 60 nm by PE-CVD. The silicon film 22 will be polycrystallized under an excimer laser to form the pixel TFT. The amorphous silicon film 22 is doped with p-type impurity ions more heavily than the substrate 10 was doped with B (p-type impurity) in FIG. 1(c). Alternatively, the film 22 may be doped when crystals are grown.

Now referring to FIG. 1(e), the silicon film 22 is exposed to an excimer laser EL for polycrystallization. The exposure produces polycrystalline silicon with an average grain size of less than 1 μm. The regions other than the pixel TFT region needs no silicon film 22. However, since the excimer laser EL is suited to exposure of all the regions, it is troublesome to select a particular region for exposure.

Referring to FIG. 1(f), a mask 3M is formed on the pixel TFT region. The polycrystalline silicon film 22p and the silicon oxide film 21, that is, the non-masked regions, are dry etched in a fluorine-based gas. Thereafter, the mask 3M is removed.

Referring to FIG. 1(g), a continuous wave (CW) laser CL is selectively shone onto the exposed, relatively thick islands-shaped amorphous silicon film 13 to change the amorphous silicon film 13 in the peripheral circuit area to a polycrystalline silicon film 13p. The CW laser may be, for example, the second harmonic of the $YVO_4$ laser. Accordingly, the polycrystalline silicon film 13p has an average grain size of 1 μm or greater, which is greater than that of the polycrystalline silicon film 22p.

Referring to FIG. 1(h), a resist mask 4M is formed to cover the desired regions of the polycrystalline silicon film 13p. Accordingly, the pixel TFT is entirely covered with the mask 4M. The periphery of the polycrystalline silicon film 13p is dry etched in a fluorine-based gas using the mask 4M. As shown in FIG. 1(h), the periphery of the silicon film 13p, which is polycrystallized for now, is removed because along the periphery, about a few micrometers from the edge, the polycrystalline silicon film, even crystallized by exposure to CW, has small grain sizes and hardly provides polycrystalline with sufficient properties. This patterning of the polycrystalline silicon film 13p leaves a polycrystalline silicon film with consistent, good properties across the film. After the etching, the resist mask 4M is removed.

Referring to FIG. 1(i), a silicon oxide film 31 is deposited up to 30-nm thickness by PE-CVD. On the film 31, a Mo film 32 with a thickness of 900 nm is formed by sputtering. The silicon oxide film 31 will provide a gate insulating film for the low-voltage high-speed-operation TFTs in the peripheral circuitry. The Mo film 32 on the film 31 will provide a gate electrode for the low-voltage high-speed-operation TFTs.

Referring to FIG. 1(j), a resist mask 5M is formed in the shape of the gate electrodes for the low-voltage high-speed-operation TFTs in the peripheral circuit area. The Mo film 32 is, where it is exposed, dry etched in a fluorine-based gas. Instead of being dry etched, the film 32 may be wet etched using a phosphoric acid/nitric acid-based etchant. After the etching, the resist mask 5M is removed.

Figure 1:
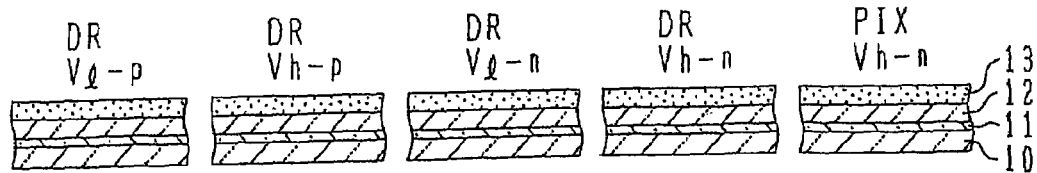
FIG. 1(a) to FIG. 1(u) are cross-sectional views illustrating individual steps according to the semiconductor device manufacturing method of working example 1.
Figure 1:
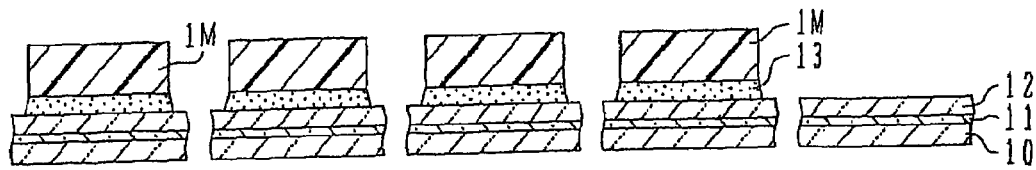
Figure 1:
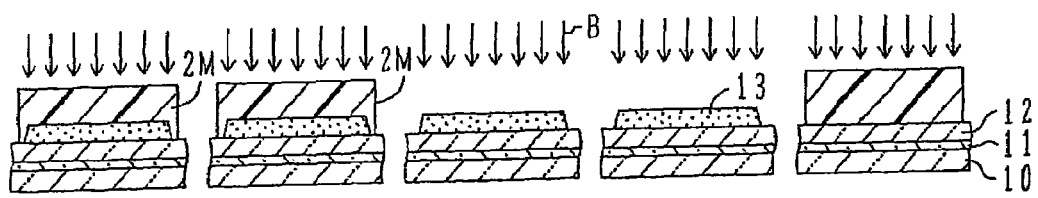
Figure 1:
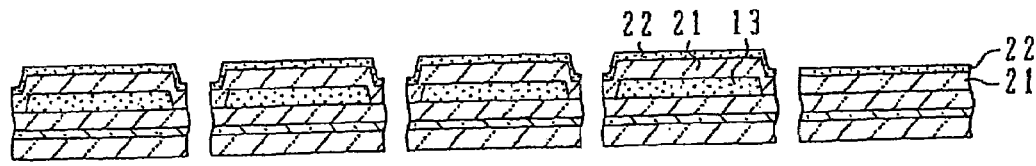
Figure 1:
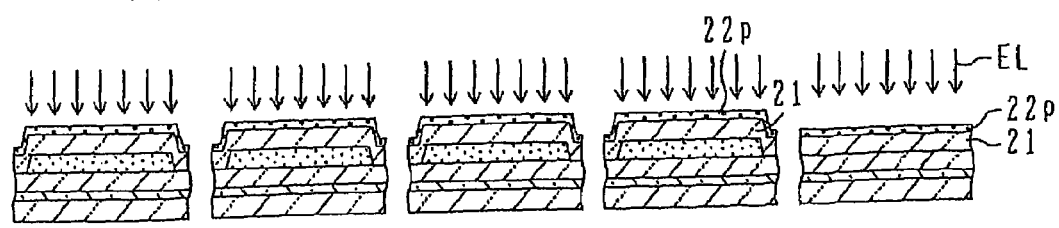
Figure 1:
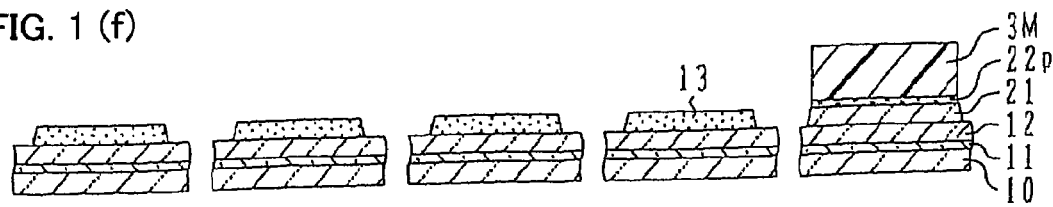
Figure 1:
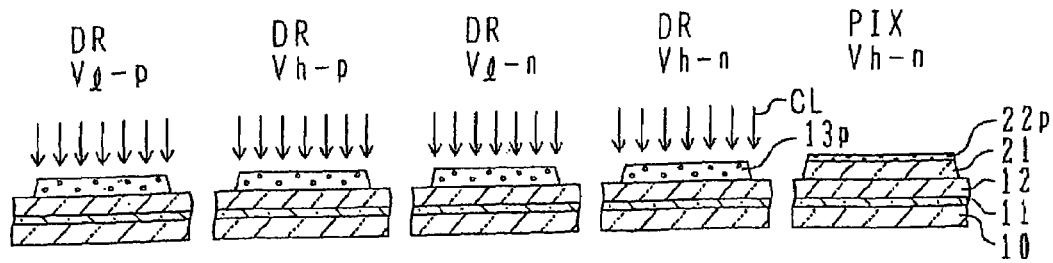
Figure 1:
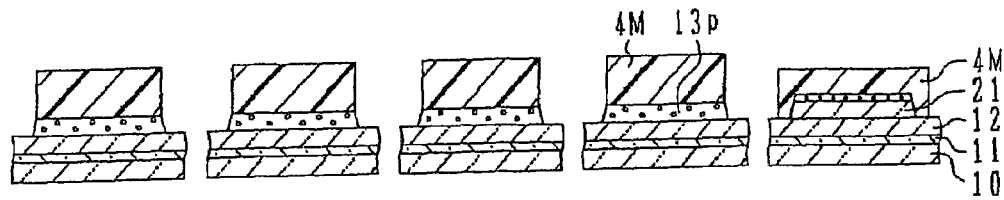
Figure 1:
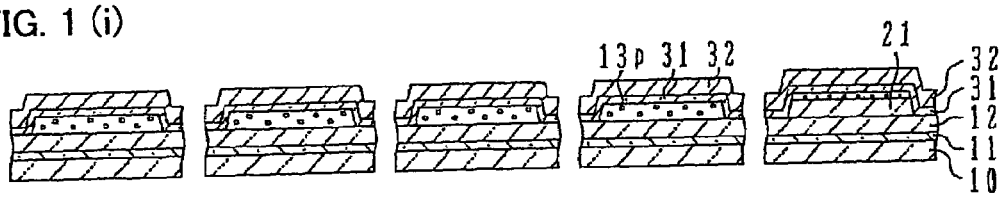
Figure 1:
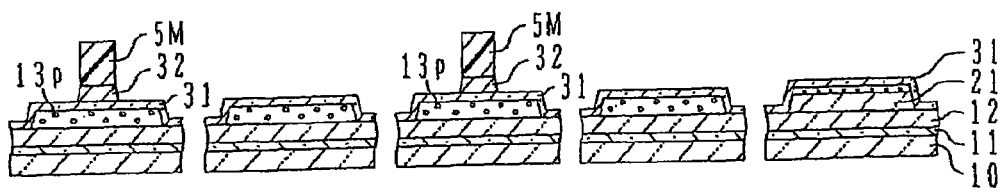
Figure 1:
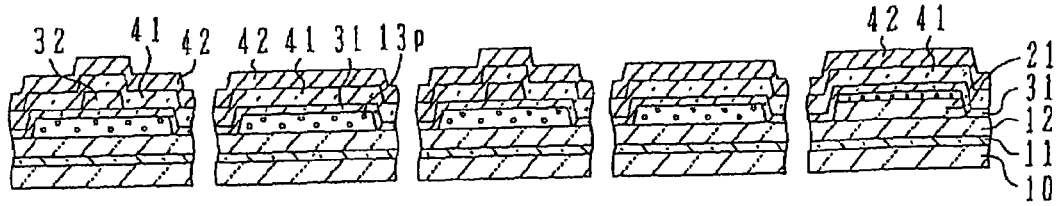
Figure 1:
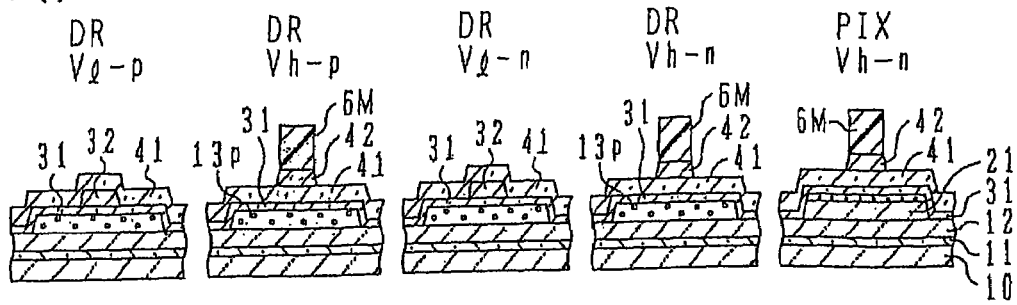
Figure 1:
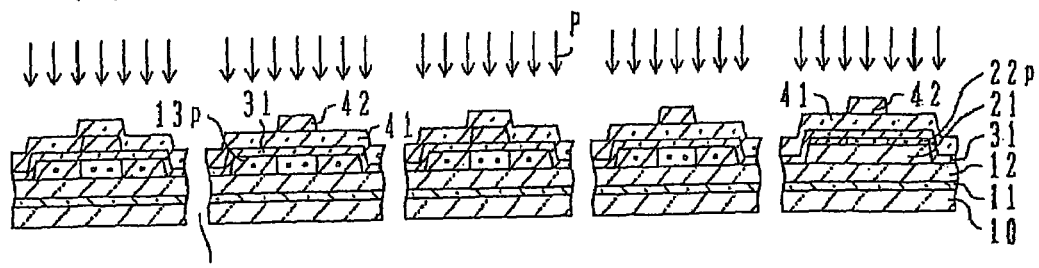
Figure 1:
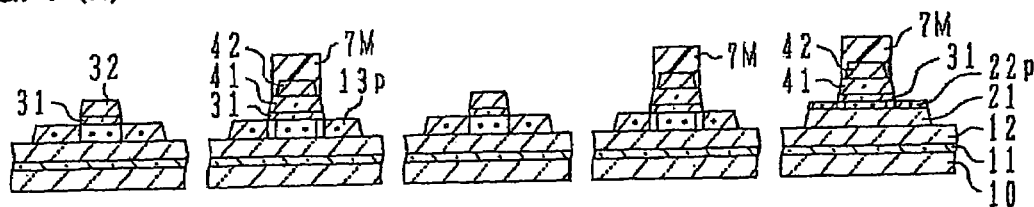
Figure 1:
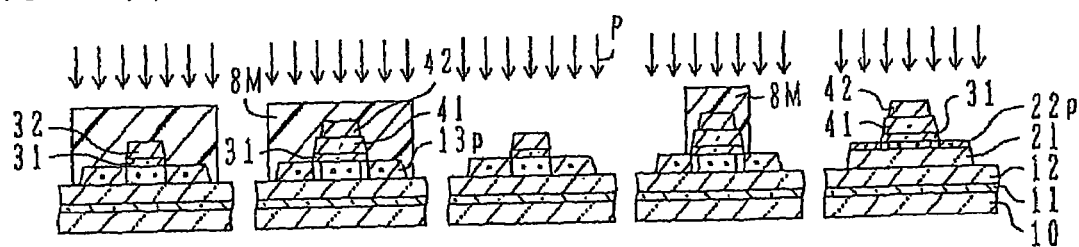
Figure 1:
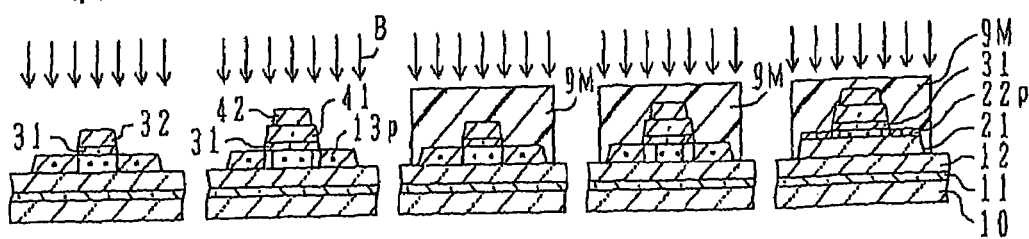
Figure 1:
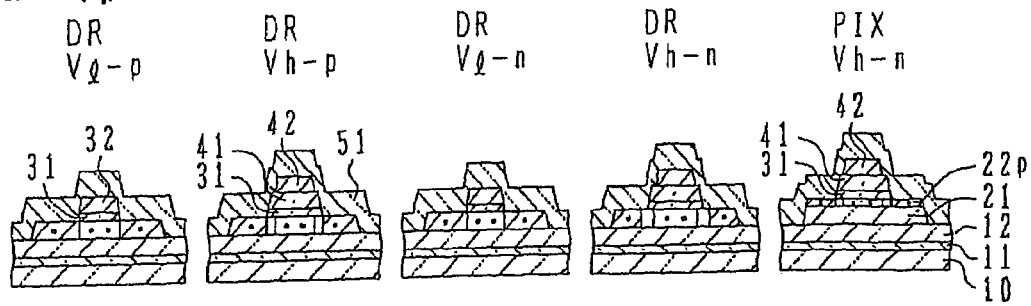
Figure 1:
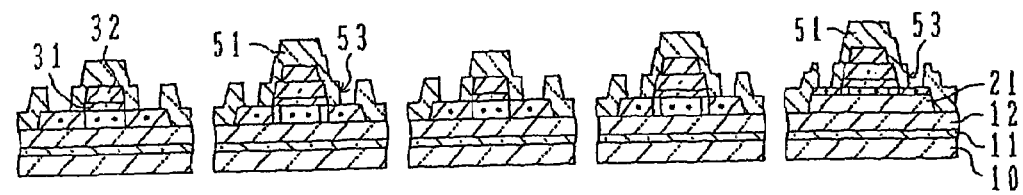
Figure 1:
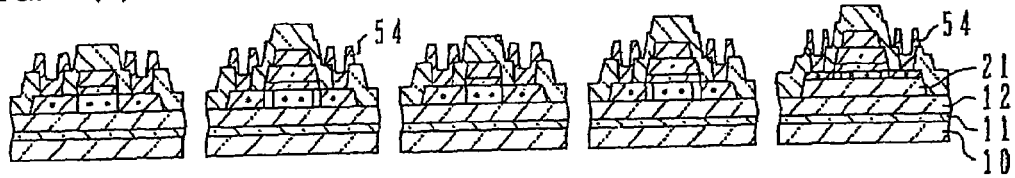
Figure 1:
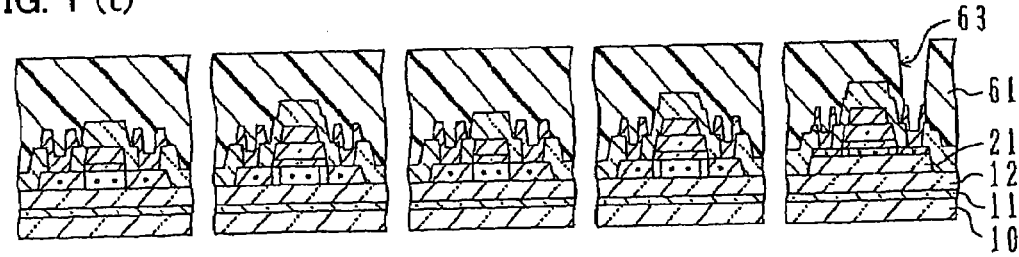
Figure 1:
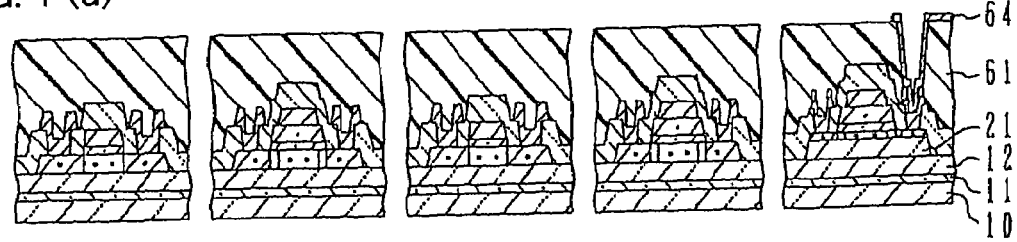

Referring to FIG. 1(*k*), a silicon oxide film is deposited on the patterned Mo film 32 and silicon oxide film 31 up to 80 nm thickness by PE-CVD. On that film, a Mo film 42 with a thickness of 300 nm is formed by sputtering. The high-voltage TFTs, including the pixel TFTs, contains a stack of the 30-nm thick silicon oxide film 31 and the 80-nm thick silicon oxide film 41 which together will provide a 110-nm thick gate insulating film. The Mo film 42 is a conducting layer which will provide a gate electrode for the high-voltage TFTs.

Referring to FIG. 1(*l*), a resist mask 6M is formed in the shape of the gate electrodes for the high-voltage transistors in the peripheral circuitry and the gate electrodes for the pixel TFTs. The Mo film 42 is then etched. The Mo film 42 may be dry etched in a fluorine-based gas or wet etched using a phosphoric acid/nitric acid-based etchant. Thereafter, the resist mask 6M is removed, which completes the fabrication of the basic structure of the TFTs in the peripheral circuit area and the pixel TFT in the display area.

Referring to FIG. 1(*m*), all the TFT regions are doped with P ions (n-type impurity) at an acceleration voltage (acceleration energy) of 60 keV to a dose of $5 \times 10^{13}$ cm$^{-2}$ with no mask. The P ions (n-type impurity) accelerated by that energy pass through the gate insulating films 41, 31, reaching the silicon films 13*p*, 22*p* below. In this stage, the LDD regions of the high-voltage TFTs in the peripheral circuit area and the pixel TFTs in the display area are doped to the same dose. The pixel TFTs are doped to the same dose as the high-voltage TFTs in the peripheral circuitry, which is not sufficient to the pixel TFTs. The p-channel TFTs are doped with the impurity in excess, to the extent that they come to show opposite polarity. This will be corrected later by doping the p-channel TFTs with a p-type impurity.

Referring to FIG. 1(*n*), a resist mask 7M is formed so that it projects from the gate electrodes of the high-voltage transistors. Using the resist mask 7M as a mask, the gate insulating films 41, 21 are dry etched in a fluorine-based gas. Thereafter, the resist mask 7M is removed. The p-channel TFTs are not prone to hot carrier degradation and do not need a LDD region. Therefore, the mask may not be formed over the p-channel TFTs.

Referring to FIG. 1(*o*), a resist mask 8M is formed which covers the p-channel TFT regions in the peripheral circuitry and the LDD regions of the high-voltage n-channel TFTs (DRVh-n). Using the resist mask 8M as a mask, the substrate 10 is doped with P ions (n-type impurity) at an acceleration energy of 90 keV to a dose of $1.5 \times 10^{13}$ cm$^{-2}$. The substrate 10 is further doped with P ions (n-type impurity) at an acceleration energy of 10 keV to a dose of $1 \times 10^{15}$ cm$^{-2}$.

In the low-voltage n-channel TFT regions, the polycrystalline silicon film on both sides of the gate electrode is subjected to these two rounds of doping. In the high-voltage n-channel TFTs, the HDD regions are subjected to the two rounds of doping. In the pixel TFTs, the silicon film below the gate insulating film projecting from the gate electrode is additionally doped with ions at high acceleration energy. In contrast, the exposed polycrystalline silicon film on both sides of the gate insulating film is subjected to the two rounds of doping. Accordingly, the LDD regions in the pixel TFTs are doped with an n-type impurity to a higher dose than the LDD regions in the peripheral-circuit high-voltage TFTs. This brings the doses in the LDD regions of the two types of TFTs to suitable levels.

In the pixel TFTs, this additional ion doping of the LDD regions increases the impurity dose in the LPD regions. The mask which covers the LDD regions in the high-voltage TFTs in the peripheral circuitry is fabricated from the same mask as the one which covers the p-channel TFT regions. There is no additional mask involved.

Referring to FIG. 1(*p*), a mask 9M is formed which covers the n-channel TFTs in the peripheral circuit area and the pixel TFTs in the display area. The polycrystalline silicon area below the gate insulating films 41, 31 is doped B ions (p-type impurity) at an acceleration energy of 70 keV to a dose of $1 \times 10^{14}$ cm$^{-2}$, to form LDD regions. Further, the regions on both sides of the gate insulating film are doped with B ions (p-type impurity) at an acceleration energy of 10 keV to a dose of $1 \times 10^{15}$ cm$^{-2}$, to form HDD regions. The P ions (n-type impurity) injected to the p-channel TFT regions are neutralized by the B ions (p-type impurity). Thereafter, the resist mask 9M is removed.

Referring to FIG. 1(*q*), a silicon oxide film and a silicon nitride film are deposited on the substrate, for example, to respective thicknesses of 60 nm and 400 nm to cover the TFT structure, so as to form an interlayer insulating film 51. The stacking of the oxide film and nitride film is intended to obtain an improved select ratio in later etching. A monolayer, either nitride or oxide, may be used instead if the etching yields a sufficient select ratio. The nitride film, following its formation, is annealed to at about 350° C. to 450° C. to hydrogenate the polycrystalline Si film. The hydrogenation improves TFT properties. If a monolayer oxide film is used, the annealing is done in a hydrogen atmosphere to hydrogenate the polycrystalline Si film.

Referring to FIG. 1(*r*), a resist mask with openings is formed on the interlayer insulating film 51. The openings are there to fabricate contact holes. Using the resist mask as a mask, the interlayer insulating film 51 is etched in a fluorine-based gas to form contact holes 53. Thereafter, the resist mask is removed.

Referring to FIG. 1(*s*), a stack of a 50-nm thick Ti layer, a 200-nm thick Al layer, and a 100-nm thick Ti layer is deposited by sputtering to form a conducting layer 54 as an electrode layer. The electrode layer 54 is then patterned by etching in a chlorine-based gas using a resist mask.

Referring to FIG. 1(*t*), a photosensitive transparent insulating film 61 is applied to cover the interlayer insulating film 51 and the electrode layer 54. Contact holes 63 are formed by shining light, and thus develop, the photosensitive transparent insulating film 61.

Referring to FIG. 1(*u*), an ITO film 64 as transparent electrodes is formed by sputtering to a thickness of 70 nm. After forming a photoresist mask on the ITO film 64, the film 64 is wet etched in an ITO etcher to leave pixel electrodes 64. Thereafter, the resist mask is removed.

The LDD regions of the pixel TFTs provide a preferable resistance value because the regions are doped with larger quantities of n-type impurity than the high-voltage TFTs in the peripheral circuit area. LCD active matrix substrates, like the one in FIG. 7, can be fabricated using the five types of TFTs formed as above.

In working example 1 detailed above, the LDD regions are doped with an impurity in the step of FIG. 1(*m*). Thereafter, the gate insulating film is patterned in the step of FIG. 1(*n*). However, these steps may be reversed in sequence as shown in FIG. 2(*a*) to FIG. 2(*c*) which are cross-sectional views illustrating the semiconductor device manufacturing method of a variation of working example 1.

Figure 2:
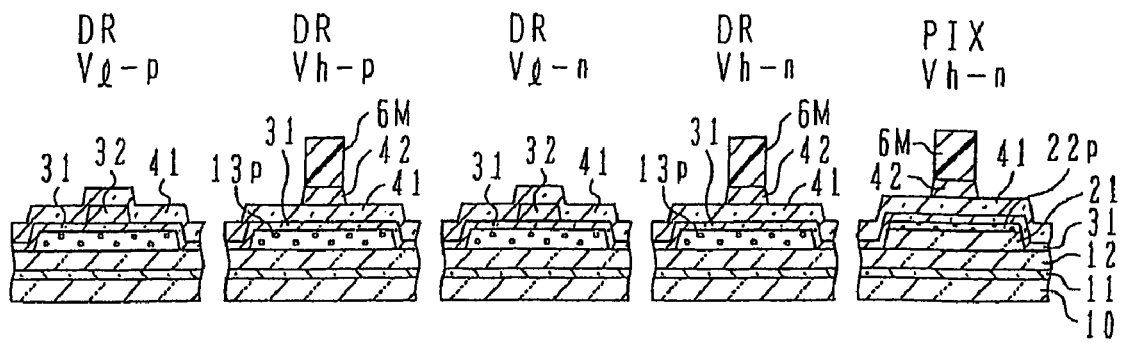
FIG. 2(a) to FIG. 2(c) are cross-sectional views illustrating individual steps according to the semiconductor device manufacturing method of a variation of working example 1.
Figure 2:
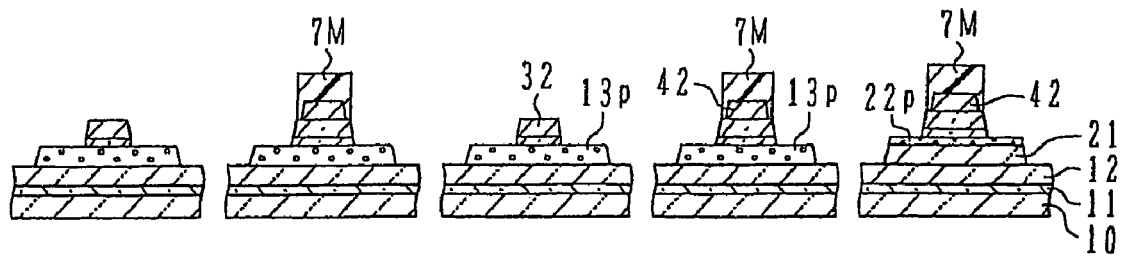
Figure 2:
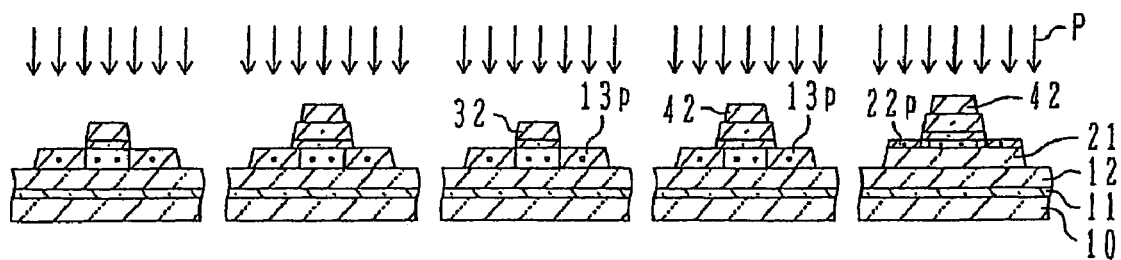

FIG. 2(*a*) shows the same step as FIG. 1(*l*).

Referring to FIG. 2(*b*), the resist mask 7M is formed, and the gate insulating film is patterned. Thereafter, the resist mask 7M is removed.

Referring to FIG. 2(c), the LDD regions are doped with P ions (n-type impurity) via the patterned gate insulating film. The ion doping is done at an acceleration energy of 90 keV and to a dose of $5\times10^{13}$ cm$^{-2}$.

Thereafter, the step of FIG. 1(o) and the succeeding steps are done in the same fashion.

In the previous working example, in the step of FIG. 1(f), the silicon film and the silicon oxide film below it are dry etched in a fluorine-based gas. However, the dry etching step may be replaced by a wet etching step of FIG. 3(a) to FIG. 3(d) which are cross-sectional views illustrating individual steps according to the semiconductor device manufacturing method of another variation of working example 1.

Figure 3:
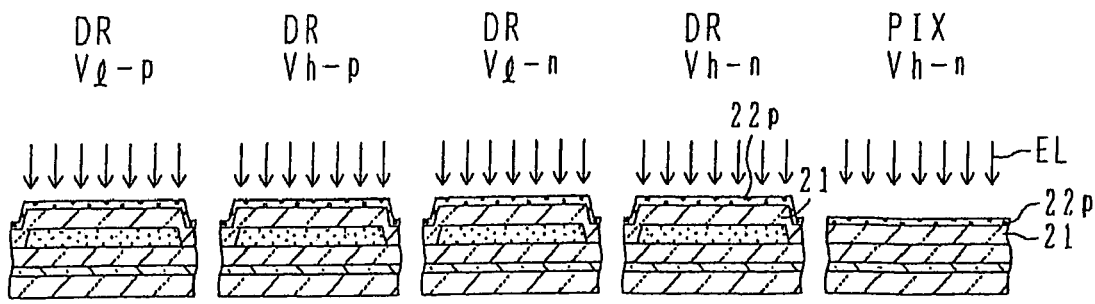
FIG. 3(a) to FIG. 3(d) are cross-sectional views illustrating individual steps according to the semiconductor device manufacturing method of another variation of working example 1.
Figure 3:
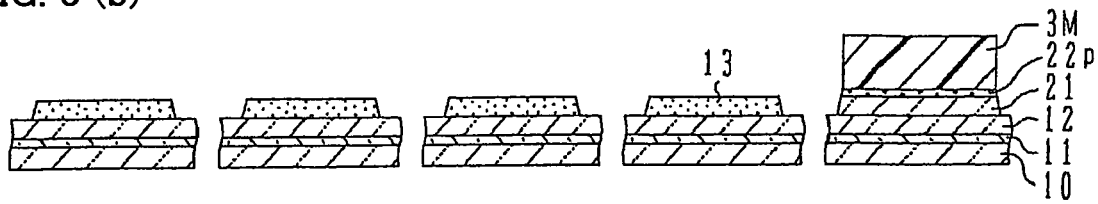
Figure 3:
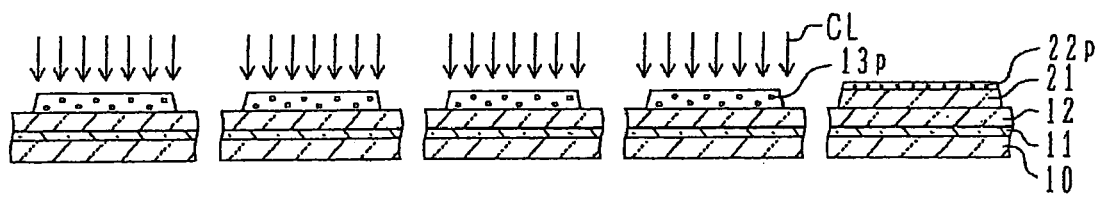
Figure 3:
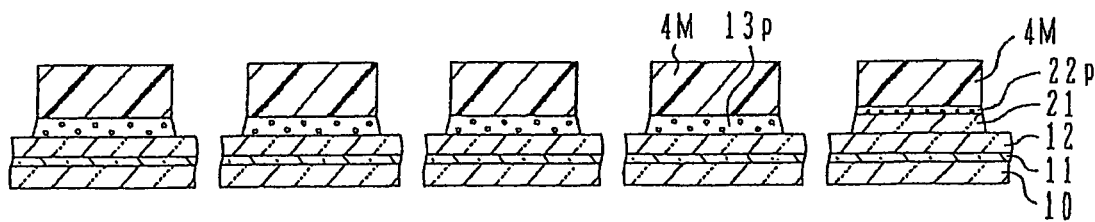

FIG. 3(a) shows the same step as FIG. 1(e). In this step, the amorphous silicon film 22 is crystallized under an excimer laser.

Referring to FIG. 3(b), a resist mask 3M is formed which covers the silicon film 22p in the pixel TFTs. The silicon film 22p and the silicon oxide film 21 below the film 22p, both in the peripheral circuit area, are etched. First, the silicon film 22p is dry etched in a fluorine-based gas. Subsequently, the silicon oxide film 21 is wet etched in dilute hydrofluoric acid, which is followed by the removal of the resist mask 3M. Wet etching entails side etching, creating undercuts below the silicon film 22p.

Referring to FIG. 3(c), the silicon film 13 in the peripheral circuit area is crystallized under a CW laser to obtain the polycrystalline silicon film 13p.

Referring to FIG. 3(d), a resist mask 4M is formed on the silicon films 13p, 22p in the shape of the TFT regions. Using the resist mask 4M, the silicon films 13p, 22p are etched in a fluorine-based gas. The undercuts are eradicated by this etching of the periphery of the silicon film 22p, as well as the silicon film 13p. Thereafter, the step of FIG. 1(i) and the succeeding steps are done.

Figure 4:
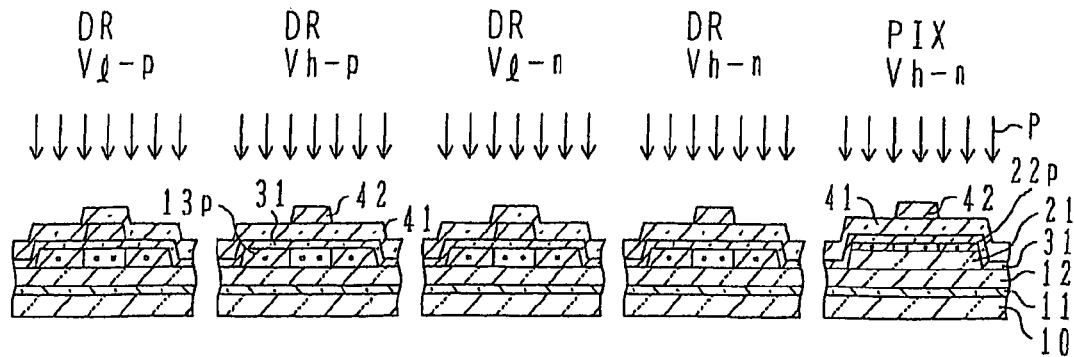
FIG. 4(a) to FIG. 4(d) are cross-sectional views illustrating individual steps according to the semiconductor device manufacturing method of working example 2.
Figure 4:
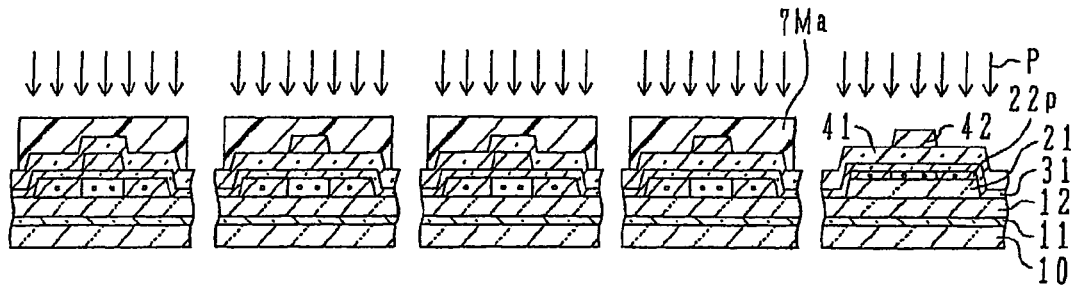
Figure 4:
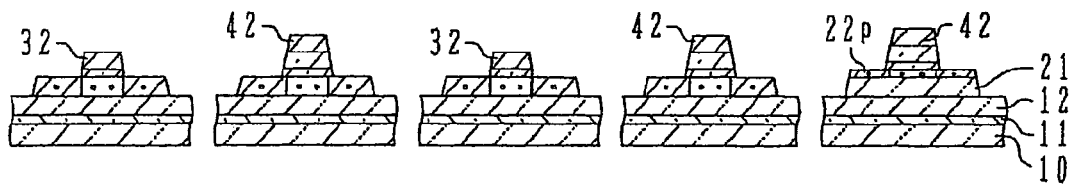
Figure 4:
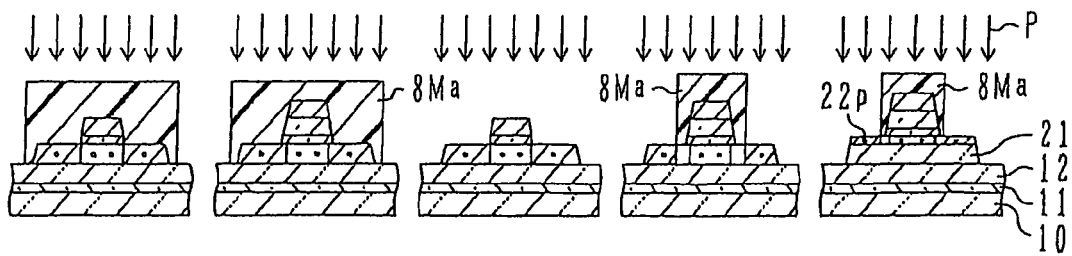

Next, another working example (working example 2) of the present invention will be described in reference to FIG. 4(a) to FIG. (d) which are schematic cross-sectional views illustrating individual steps according to the semiconductor device manufacturing method of working example 2. FIG. 4(a) shows the same step as FIG. 1(m). Referring to FIG. 4(a), the LDD regions are doped with P ions (n-type impurity) at an acceleration voltage of 90 keV and to a dose of $5\times10^{13}$ cm$^{-2}$. The LDD regions are formed in this manner for the high-voltage n-channel TFTs in the peripheral circuitry. This dose is insufficient to the pixel TFTs.

Referring to FIG. 4(b), a resist mask 7Ma is formed masking the TFT regions other than the pixel TFTs. The pixel TFTs are doped with P ions (n-type impurity) at an acceleration voltage of 9.0 keV to a dose of $1.5\times10^{13}$ cm$^{-2}$. This ion doping provides additional ion doping to the pixel TFTs; the doses in the LDD regions increase to suitable levels. A mask is used in the ion doping. The ion doping is however targeted at the LDD regions. Therefore, it is no longer necessary to form the gate insulating film so that it projects from the gate electrodes.

Referring to FIG. 4(c), without using a mask, using the gate electrodes 42, 32 as a mask, reactive ion etching is done in a fluorine-based gas. This etches the gate insulating films 41, 31.

A mask is used in the ion doping of the LDD regions of the pixel TFTs. Reducing the number of masks used in the etching of the gate insulating film in this fashion prevents the total mask count from increasing.

Referring to FIG. 4(d), a resist mask 8Ma is formed which covers the p-channel TFTs and the LDD regions of the high-voltage n-channel TFTs. The uncovered regions are doped with P ions (n-type impurity) at an acceleration energy of 10 keV to a dose of $1\times10^{15}$ cm$^{-2}$. The HDD regions of the n-channel TFTs are doped with an impurity. In addition, the mask covering the LDD regions covers the p-channel TFTs too. Thus, the mask count does not increases. Thereafter, the step of FIG. 1(p) and the succeeding steps are done.

In working example 2 above, the LDD regions of the pixel TFTs again provide a preferable resistance value because the regions are doped with larger quantities of n-type impurity than the LDD regions in the high-voltage TFTs in the periphery driver circuitry. In addition, it is not necessary to provide the p-channel TFTs with LDD regions. The following will describe an exemplary manufacturing method whereby the p-channel TFTs are to be provided with no LDD regions (working example 3) in reference to FIG. 5(a) to FIG. 5(h).

FIG. 5(a) to FIG. 5(h) are schematic cross-sectional views illustrating individual steps according to the semiconductor device manufacturing method of working example 3.

Figure 5:
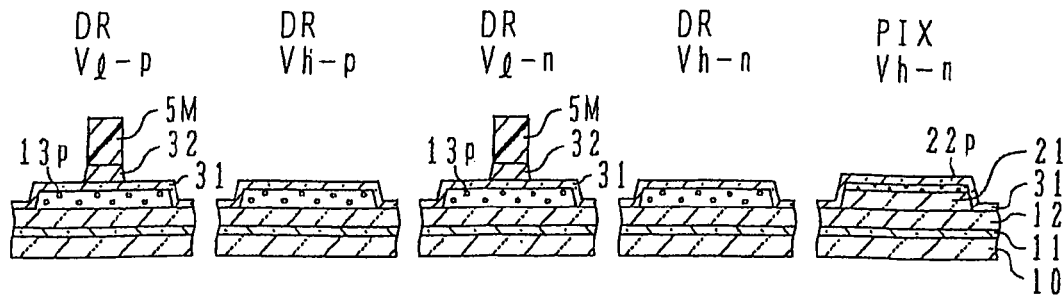
FIG. 5(a) to FIG. 5(h) are cross-sectional views illustrating individual steps according to the semiconductor device manufacturing method of working example 3.
Figure 5:
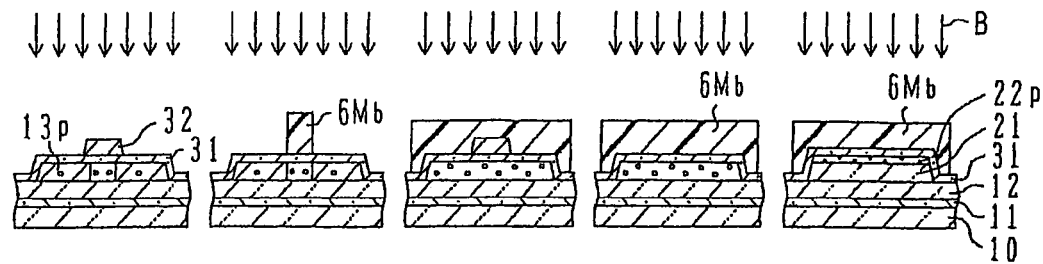
Figure 5:
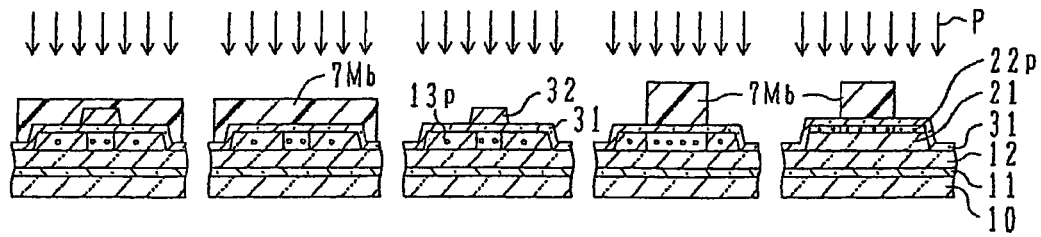
Figure 5:
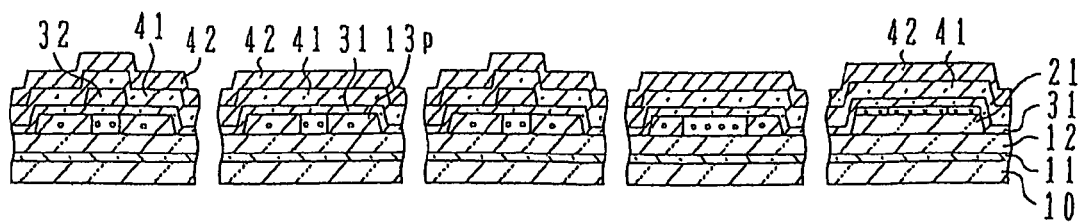
Figure 5:
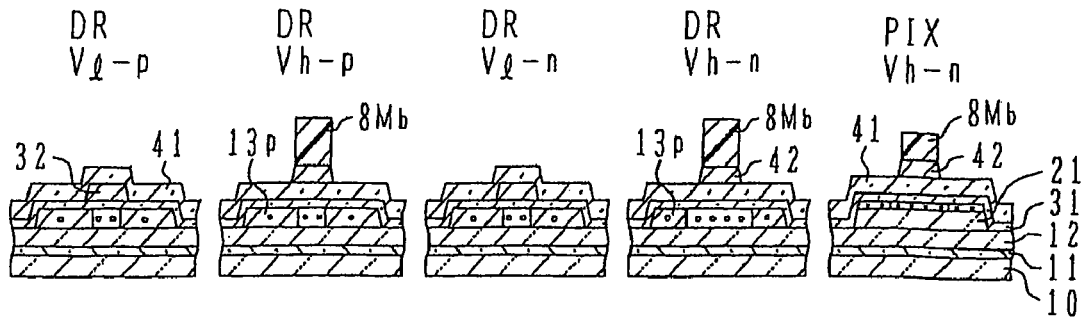
Figure 5:
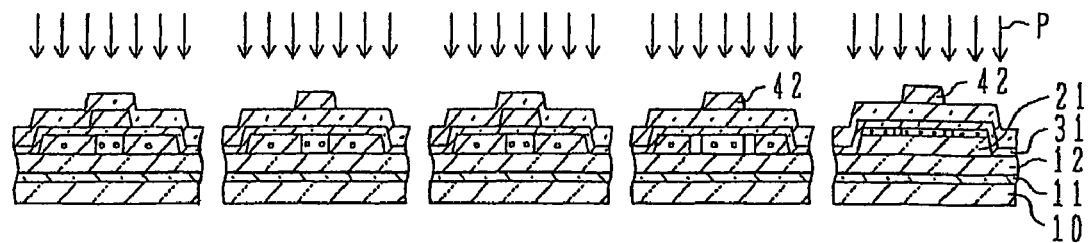
Figure 5:
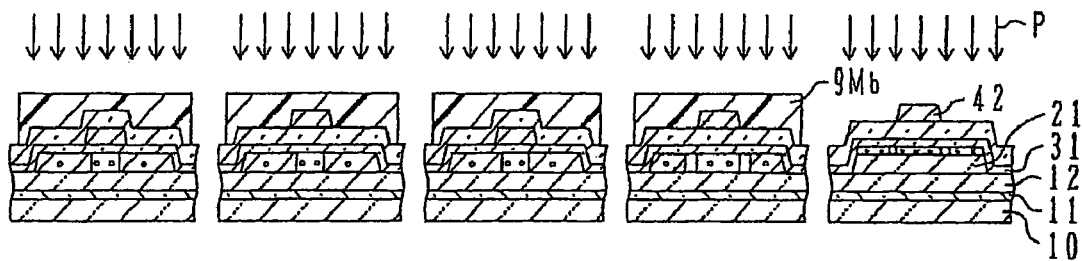
Figure 5:
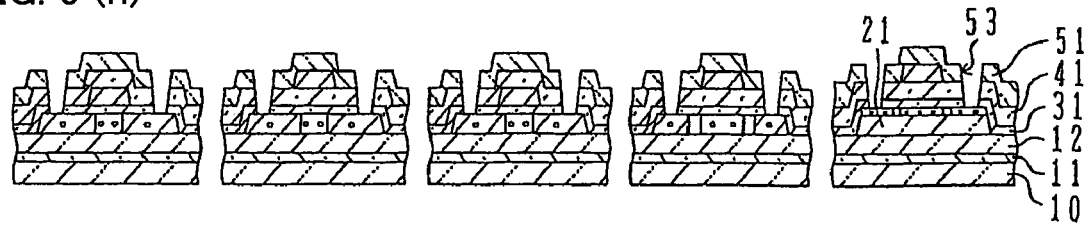

FIG. 5(a) shows the same step as FIG. 1(j). This step forms the polycrystalline silicon film 13p with relatively large grain sizes for the peripheral circuit area and the polycrystalline silicon film 22p with relatively small grain sizes for the pixel TFTs. On these polycrystalline silicon films are provided the silicon oxide film 31 having a relatively large thickness of 30 nm and the Mo film 32 having a thickness of 300 nm. The resist mask 5M is formed in the shape of the gate electrodes of the low-voltage high-speed-operation TFTs. The exposed Mo film 32 is either dry etched in a fluorine-based gas or wet etched using a phosphoric acid/nitric acid-based etchant. Thereafter, the resist mask 5M is removed.

Referring to FIG. 5(b), a cover resist mask 6Mb is formed which covers the gate electrode regions and n-channel TFT regions of the high-voltage p-channel TFTs in the peripheral circuit area and the pixel TFT regions in the display area.

The p-channel TFTs are doped with B ions (p-type impurity) at an acceleration energy of 30 keV to a high dose of $1\times10^{15}$ cm$^{-2}$ to form HDD regions in the p-channel TFTs. Thereafter, the resist mask 6Mb is removed.

Referring to FIG. 5(c), a resist mask 7Mb is formed to cover the p-channel TFT regions, the high-voltage TFTs in the peripheral circuitry, and the channel regions and LDD regions of the pixel TFTs. Using the resist mask 7Mb as a mask, The n-channel TFTs are doped with P ions (n-type impurity) at an acceleration energy of 30 keV to a high dose of $1\times10^{15}$ cm$^{-2}$ to form HDD regions in the n-channel TFTs. Thereafter, the resist mask 7Mb is removed.

Referring to FIG. 5(d), an additional silicon oxide film 41 is deposited to a thickness of 80 nm by PE-CVD to form a relatively thick gate insulating film. On the film 41, a thickness 300 nm is formed by sputtering.

Referring to FIG. 5(e), a resist mask 8Mb is formed in the shape of the gate electrodes of the high-voltage TFTs. The Mo film 42 is patterned by either dry etching or wet etching. In the present working example, the HDD regions are doped with ions first. Therefore, in the high-voltage p-channel TFTs, the gate electrodes are formed either in contact with or entering the HDD regions. Therefore, the high-voltage p-channel TFTs are provided with no LDD regions. In the high-voltage TFTs and pixel TFTs, predetermined regions are formed between the gate electrodes 42 and the HDD regions. Those regions define the LDD regions.

Referring to FIG. 5(f), using the gate electrodes as a mask, the LDD regions in the high-voltage TFTs in the peripheral circuitry and the pixel TFTs are doped with P ions (n-type impurity) at an acceleration energy of 90 keV to a dose of $5 \times 10^{13}$ cm$^{-2}$.

Referring to FIG. 5(g), a resist mask 9Mb is formed which covers the TFTs in the peripheral circuit area. The pixel TFT regions are doped with P ions (n-type impurity) at an acceleration energy of 90 keV to a dose of $1.0 \times 10^{14}$ cm$^{-2}$. In the pixel TFTs, the LDD regions are additionally doped with ions. Thereafter, the resist mask 9Mb is removed.

Referring to FIG. 5(h), on the substrate already provided with the TFTs, a silicon nitride film 51 is deposited to a thickness of 40 nm by PE-CVD. A resist mask having a contact hole pattern is formed. The silicon nitride film 51 and the gate insulating films 41, 31 are etched in a fluorine-based gas to cut contact holes 53. Thereafter, the resist mask is removed.

Succeeding steps are the same as that of FIG. 1(s) and the succeeding ones.

In the above working examples, the silicon film polycrystallized under an excimer laser and the silicon film polycrystallized under a CW laser are formed from amorphous silicon films which are formed individually. However, the two types of polycrystalline silicon films may be formed from the same amorphous silicon film as the starting material. The following will describe a working example (working example 4) where the films are formed from the same amorphous silicon film as the starting material in reference to FIG. 6(a) to FIG. 6(f).

FIG. 6(a) to FIG. 6(f) are schematic cross-sectional views illustrating individual steps according to the semiconductor device manufacturing method of working example 4.

Figure 6:
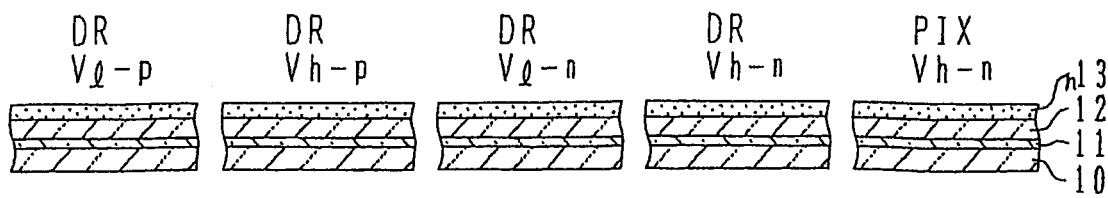
FIG. 6(a) to FIG. 6(f) are cross-sectional views illustrating individual steps according to the semiconductor device manufacturing method of working example 4.
Figure 6:
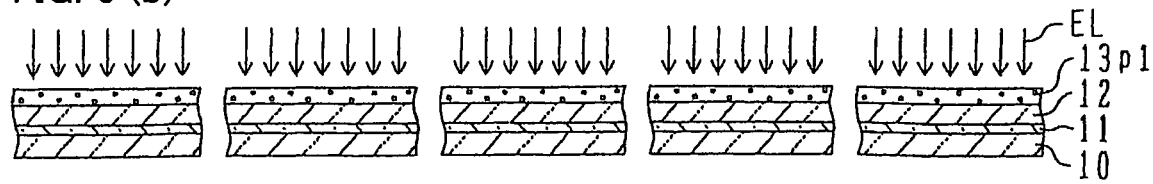
Figure 6:
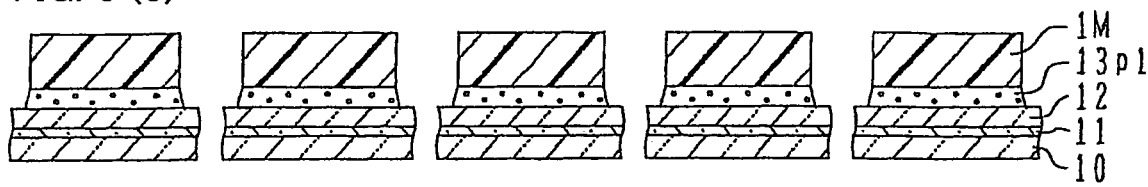
Figure 6:
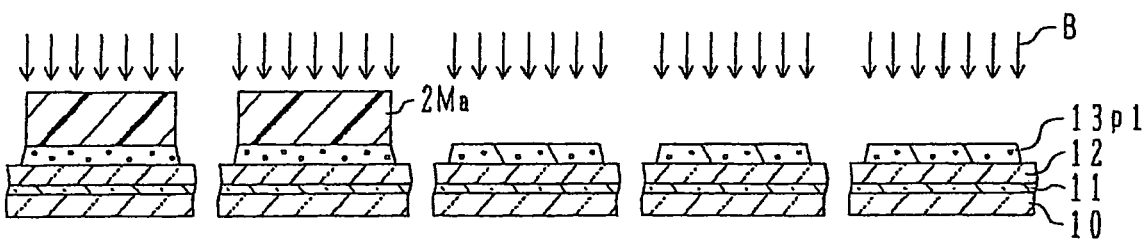
Figure 6:
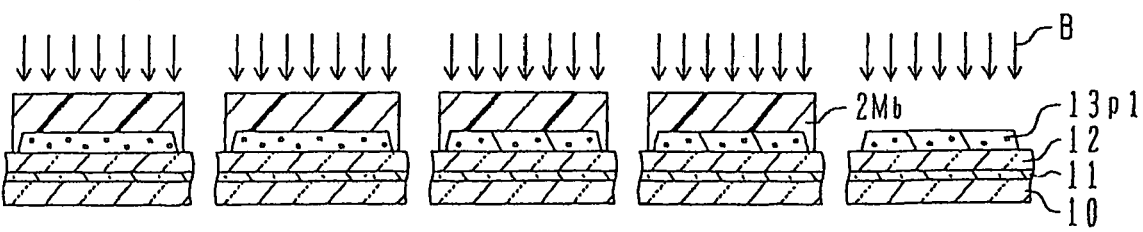
Figure 6:
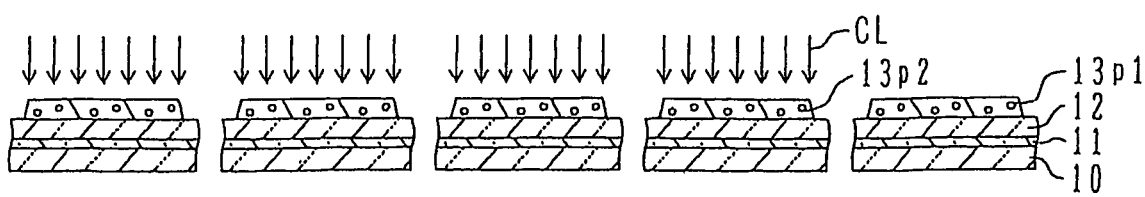

Referring to FIG. 6(a), on the glass substrate 10, a 50-nm thick silicon nitride film 11 and a 200-nm thick silicon oxide film 12 are sequentially deposited by PE-CVD. On the films 11, 12, an amorphous silicon film n13 is deposited to a thickness of 50 to 60 nm by PE-QVD.

Referring to FIG. 6(b), an excimer laser EL is shone onto the deposited amorphous silicon film n13 to obtain a polycrystalline silicon film 13p1. As shown in FIG. 6(c), a resist mask 1M is formed on the polycrystalline silicon film 13p1 to cover the TFT regions. The polycrystalline silicon film 13p1 is then etched by, for example, dry etching in a fluorine-based gas.

Referring to FIG. 6(d), a resist mask 2Ma is formed which covers the p-channel TFT regions. The n-channel TFT region is doped with B ions (p-type impurity) for the provision of threshold.

Referring to FIG. 6(e), a resist mask 2Mb with openings is formed in the pixel TFT regions. The pixel TFT regions are additionally doped with B ions (p-type impurity) for adjustment of threshold. Thereafter, the resist mask 2Mb is removed.

Referring to FIG. 6(f), a CW laser CL is shone onto the polycrystalline silicon film in the peripheral circuit area for polycrystallization. Accordingly, a polycrystalline silicon film 13p2 with relatively large grain sizes is formed. These steps enable the same amorphous silicon film as the starting material to be fabricated into the polycrystalline silicon film 13p2 polycrystallized under a CW laser and the polycrystalline silicon film 13p1 polycrystallized under an excimer laser EL. The silicon film 13p1 polycrystallized under an excimer laser is additionally doped with p-type impurity ions. Therefore, the silicon film 13p1 polycrystallized under an excimer laser can sustain a substantially equal threshold level to that of the silicon film polycrystallized under a CW laser. Thereafter, the step shown in FIG. 1(h) and the succeeding ones are done in the same fashion.

According to the aforementioned working example, the TFTs on the active matrix substrate of FIG. 7 are formed. Members other than the TFTs are formed by publicly known processes. An EL display may be formed.

Figure 9:
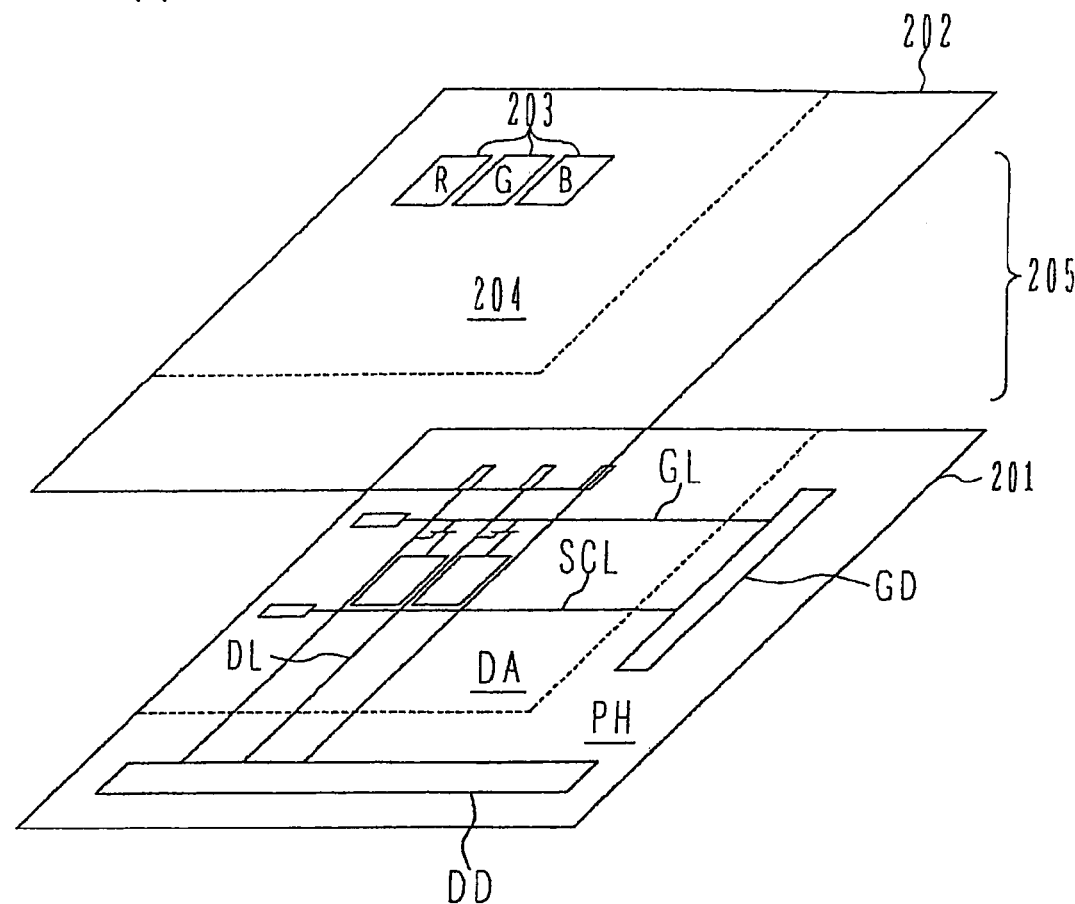
FIG. 9(a) and FIG. 9(b) are a perspective and a cross-sectional view, respectively, illustrating an exemplary structure of a display device.
Figure 9:
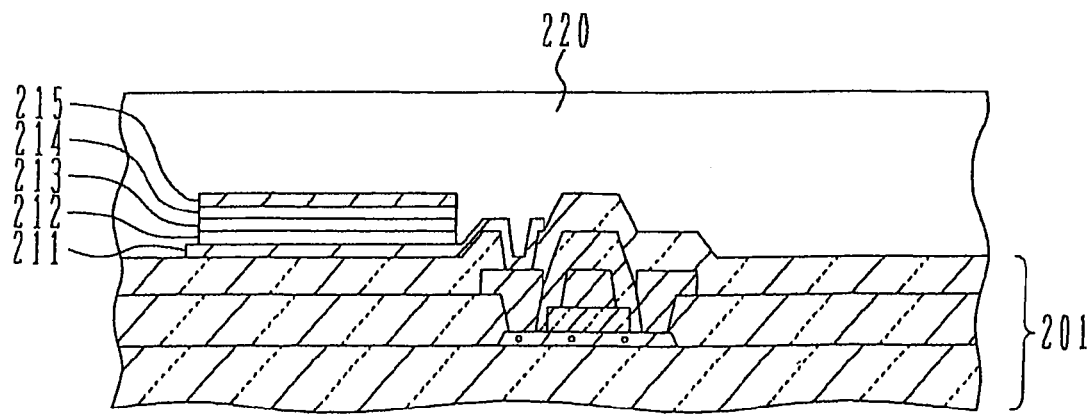

FIG. 9(a) is a perspective view illustrating an exemplary structure of a liquid crystal display. An active matrix substrate 201 has an display area DA and a peripheral circuit area PH. In the display area DA, there are provided scan-use gate lines GL, supplemental capacitor bus lines SCL, data lines DL, and pixel structures. In the peripheral circuit area PH, there is provided a gate control circuit GD and a data control circuit DD. On an opposite substrate 202, there are provided color filters 203 corresponding to pixel regions and a common electrode 204 which is used commonly by all the pixels. A liquid crystal layer 205 is sandwiched between the opposite substrate (color filter substrate) 202 and the active matrix substrate 201.

FIG. 9(b) is a cross-sectional view illustrating exemplary structure of an organic EL panel. As in the previous working example, the active matrix substrate 201 has scan-use gate lines, data lines, thin film TFTs, etc. on a glass substrate. In each pixel region, the TFT source is connected to an anode 211 made of, for example, ITO. On the anode 211 are there sequentially layered a hole transport layer 212, a light-emitting layer 213, an electron transport layer 214, and a cathode 215 made of, for example, aluminum, so as to provide an organic EL element structure. The light emitted by the organic EL element travels downwards and exits the active matrix substrate 201 through the glass substrate. The top of the organic EL element is sealed covered with a sealing material 220.

The present invention has been described so far by way of working examples. The present invention is however not limited by them. For example, the depicted materials and thicknesses are mere examples; they can be varied depending on design. For example, the glass substrate may be replaced with a quartz substrate or other transparent insulating substrate. In addition, the gate electrode layer may be any metal layer that is electrically conducting and thermostable. Further, apart from B and P, the p-type impurity and the n-type impurity may be Sb, As, or other impurities. The gate insulating film may be an insulating layer made of any material other than silicon oxide: for example, an oxidation silicon nitride layer, a silicon nitride layer, or an organic insulating layer it would be obvious to a person skilled in the art that there are also lost of possible variations, modifications and combinations.

As described in the foregoing, according to the present invention, TFTs which withstand high voltage and allows for small leak current and those which withstand high voltage and exhibit high drain current density are obtained from polycrystalline semiconductor films having relatively large grain sizes (first, second, and fourth islands-shaped polycrystalline silicon layers) and a polycrystalline semiconductor film having relatively small grain sizes (third islands-shaped polycrystalline silicon layer). In addition, property shortcomings can be adjusted by selective doping.

In the semiconductor device of the present invention, it is preferable if: the first and second islands-shaped polycrystalline silicon layers are amorphous silicon layers, as a starting material, which are polycrystallized under a CW laser; and the third polycrystalline silicon layer is an amorphous silicon layer, as a starting material, which is polycrystallized under an excimer laser.

In the semiconductor device of the present invention, it is preferable if: the first and second islands-shaped polycrystalline silicon layers have an average grain size of 1 μm or greater and a thickness of 50 nm or greater; and the third islands-shaped polycrystalline silicon layer has an average grain size of less than 1 µm and a thickness of 40 to 60 nm.

In the semiconductor device of the present invention, it is preferable if: the insulating substrate is a glass substrate; the first and second thin film transistors constitute peripheral circuitry for a liquid crystal display; and the third thin film transistors constitute pixel transistors for the liquid crystal display.

In addition, it is preferable if the first and second channel regions have a different n-type impurity dose from the third channel regions.

In the method of manufacturing a semiconductor device of the present invention, in step (g) of masking a gate insulating film on the fourth islands-shaped polycrystalline silicon layer and the second islands-shaped polycrystalline silicon layer and adding an n-type impurity at a different acceleration voltage, it is preferable if the n-type impurity is added by ion doping at such an acceleration voltage that the n-type impurity passes through the third gate insulating film and at such an acceleration voltage that the n-type impurity does not pass through the third gate insulating film.

It is preferable if the method of manufacturing a semiconductor device of the present invention further includes the step of (j) masking a predetermined width from both ends of the gate electrodes on the fourth, second, and third islands-shaped polycrystalline silicon layers and adding an n-type impurity to a high concentration.

Further, it is preferable if the first to fourth islands-shaped polycrystalline silicon layers are formed from one amorphous silicon layer.

The embodiments and working examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor device, comprising:
   an insulating substrate;
   first and second islands-shaped polycrystalline silicon layers provided above the insulating substrate and having relatively large grain sizes;
   a third islands-shaped polycrystalline silicon layer provided above the insulating substrate and having relatively small grain sizes;
   a first gate insulating film provided on the first islands-shaped polycrystalline silicon layer and having a first thickness;
   a second gate insulating film provided on the second islands-shaped polycrystalline silicon layer and having a second thickness which is greater than the first thickness;
   a third gate insulating film provided on the third islands-shaped polycrystalline silicon layer and having a third thickness which is greater than the first thickness;
   first, second, and third gate electrodes provided on the first, second, and third gate insulating films to define first, second, and third channel regions therebelow;
   first, second, and third n-type high-concentration source/drain regions formed by adding an n-type impurity to a high concentration outside the first, second, and third channel regions; and
   second and third n-type low-concentration source/drain regions provided between the second and third channel regions and the second and third n-type high-concentration source/drain regions, the second and third n-type low-concentration source/drain regions having a lower n-type impurity dose than the n-type high-concentration source/drain regions,
   wherein the third n-type low-concentration source/drain regions have a higher n-type impurity dose than the second n-type low-concentration source/drain regions.

2. The semiconductor device of claim 1, wherein the first, second, and third islands-shaped polycrystalline silicon layers containing the n-type high-concentration source/drain regions and the n-type low-concentration source/drain regions, the first, second, and third gate insulating films, and the first, second, and third gate electrodes constitute first, second, and third thin film transistors.

3. The semiconductor device of claim 1, wherein:
   the first and second islands-shaped polycrystalline silicon layers are amorphous silicon layers, as a starting material, which are polycrystallized under a CW laser; and
   the third polycrystalline silicon layer is an amorphous silicon layer, as a starting material, which is polycrystallized under an excimer laser.

4. The semiconductor device of claim 3, wherein:
   the first and second islands-shaped polycrystalline silicon layers have an average grain size of 1 µm or greater and a thickness of 50 nm or greater; and
   the third islands-shaped polycrystalline silicon layer has an average grain size of less than 1 µm and a thickness of 40 to 60 nm.

5. The semiconductor device of claim 2, wherein:
   the insulating substrate is a glass substrate;
   the first and second thin film transistors constitute peripheral circuitry for a liquid crystal display; and
   the third thin film transistors constitute pixel transistors for the liquid crystal display.

6. The semiconductor device of claim 1, wherein the first and second channel regions have a different n-type impurity dose from the third channel regions.

* * * * *